United States Patent
Lin et al.

(10) Patent No.: US 10,224,905 B1
(45) Date of Patent: Mar. 5, 2019

(54) METHOD AND APPARATUS FOR HIGH SPEED CLOCK TRANSMISSION

(71) Applicant: Realtek Semiconductor Corp., Hsinchu (TW)

(72) Inventors: Chia-Liang (Leon) Lin, Fremont, CA (US); Fei Song, San Jose, CA (US)

(73) Assignee: REALTEK SEMICONDUCTOR CORP., Hsinchu (TW)

(*) Notice: Subject to any disclaimer, the term of this patent is extended or adjusted under 35 U.S.C. 154(b) by 0 days.

(21) Appl. No.: 15/964,389

(22) Filed: Apr. 27, 2018

(51) Int. Cl.
    *H03K 3/023* (2006.01)
    *H03K 3/356* (2006.01)
    *H03K 3/011* (2006.01)

(52) U.S. Cl.
    CPC ............ *H03K 3/023* (2013.01); *H03K 3/011* (2013.01); *H03K 3/356104* (2013.01)

(58) Field of Classification Search
    CPC ... H03K 3/023; H03K 3/011; H03K 3/356104
    See application file for complete search history.

(56) References Cited

U.S. PATENT DOCUMENTS

| | | | |
|---|---|---|---|
| 2009/0029668 A1* | 1/2009 | Hsieh | H03D 7/1441 455/324 |
| 2009/0295514 A1* | 12/2009 | Lee | H04L 25/03878 333/28 R |
| 2016/0276991 A1* | 9/2016 | Lin | H03F 1/0205 |

\* cited by examiner

*Primary Examiner* — Seokjin Kim
(74) *Attorney, Agent, or Firm* — McClure, Qualey & Rodack, LLP

(57) ABSTRACT

A method comprises: receiving a differential input signal; converting the differential input signal into a first transmitted current and a second transmitted current using a common-source differential pair biased by a bias current; launching the first transmitted current and the second transmitted current onto a first port of a differential transmission line; receiving a first received current and a second received current from a second port of the differential transmission line; buffering the first received current and the second received current into a first output current and a second output current, respectively, using a current buffer, wherein the current buffer comprises: a common-gate amplifier pair, a first cross-coupling network configured to provide a negative feedback on the input side of the current buffer to reduce an input impedance of the current buffer, and a second cross-coupling network configured to provide a positive feedback on the output side of the current buffer to boost an output impedance of the current buffer; and terminating the first output current and the second output current with a load to establish a differential output signal.

20 Claims, 3 Drawing Sheets

METHOD AND APPARATUS FOR HIGH SPEED CLOCK TRANSMISSION

BACKGROUND OF THE DISCLOSURE

Field of the Disclosure

The present disclosure generally relates to clock transmission, and more particularly high-speed clock transmission circuits.

Description of Related Art

As is known, a clock is a voltage signal that oscillates between a low level and a high level. Clocks are widely used in synchronous digital circuits for coordinating actions of the synchronous digital circuits. An integrated circuit that contains a plurality of synchronous digital circuits usually has a clock generation circuit, e.g. a phase lock loop, configured to generate a clock, which usually needs to be transmitted through a transmission line to the plurality of synchronous digital circuits to coordinate actions thereof. In a case where the clock generation circuit and a synchronous digital circuit that needs to receive the clock from the clock generation circuit are physically separated by a long distance (long in relation to the clock frequency), the transmission of the clock can be challenging. The-long distance transmission of the clock usually suffers a large insertion loss, resulting in a weak signal on the receiving end. The problem worsens when the clock is a high-speed clock, since the insertion loss of a transmission line increases as a frequency of the transmitted signal increases.

What is desired is a method for transmitting a high-speed clock over a long transmission line, such that the signal on the receiving end can still be large.

SUMMARY OF THE DISCLOSURE

In an embodiment, a circuit comprises: a current source configured to output a bias current to a first node; a common-source differential amplifier pair configured to receive the bias current and output a first transmitted current and a second transmitted current to a second node and a third node, respectively, in accordance with a control of a differential input signal; a differential transmission line configured to receive the first transmitted current and the second transmitted current from the second node and the third node and output a first received current and a second received current to a fourth node and a fifth node, respectively; a current buffer configured to receive the first received current and the second received current from the fourth node and the fifth node and output a first output current and a second output current to a sixth node and a seventh node, respectively, wherein: the current buffer comprises: a common-gate amplifier pair, a first cross-coupling network configured to provide a negative feedback on the input side of the current buffer to reduce an input impedance of the current buffer, and a second cross-coupling network configured to provide a positive feedback on the output side of the current buffer to boost an output impedance of the current buffer; and a load configured to provide a termination at the sixth node and the seventh node to establish a first output voltage and a second output voltage, respectively.

In an embodiment, a method comprises: receiving a differential input signal; converting the differential input signal into a first transmitted current and a second transmitted current using a common-source differential pair biased by a bias current; launching the first transmitted current and the second transmitted current onto a first port of a differential transmission line; receiving a first received current and a second received current from a second port of the differential transmission line; buffering the first received current and the second received current into a first output current and a second output current, respectively, using a current buffer, wherein the current buffer comprises: a common-gate amplifier pair, a first cross-coupling network configured to provide a negative feedback on the input side of the current buffer to reduce an input impedance of the current buffer, and a second cross-coupling network configured to provide a positive feedback on the output side of the current buffer to boost an output impedance of the current buffer; and terminating the first output current and the second output current with a load to establish a differential output signal.

DETAILED DESCRIPTION OF THIS DISCLOSURE

Figure 1A:
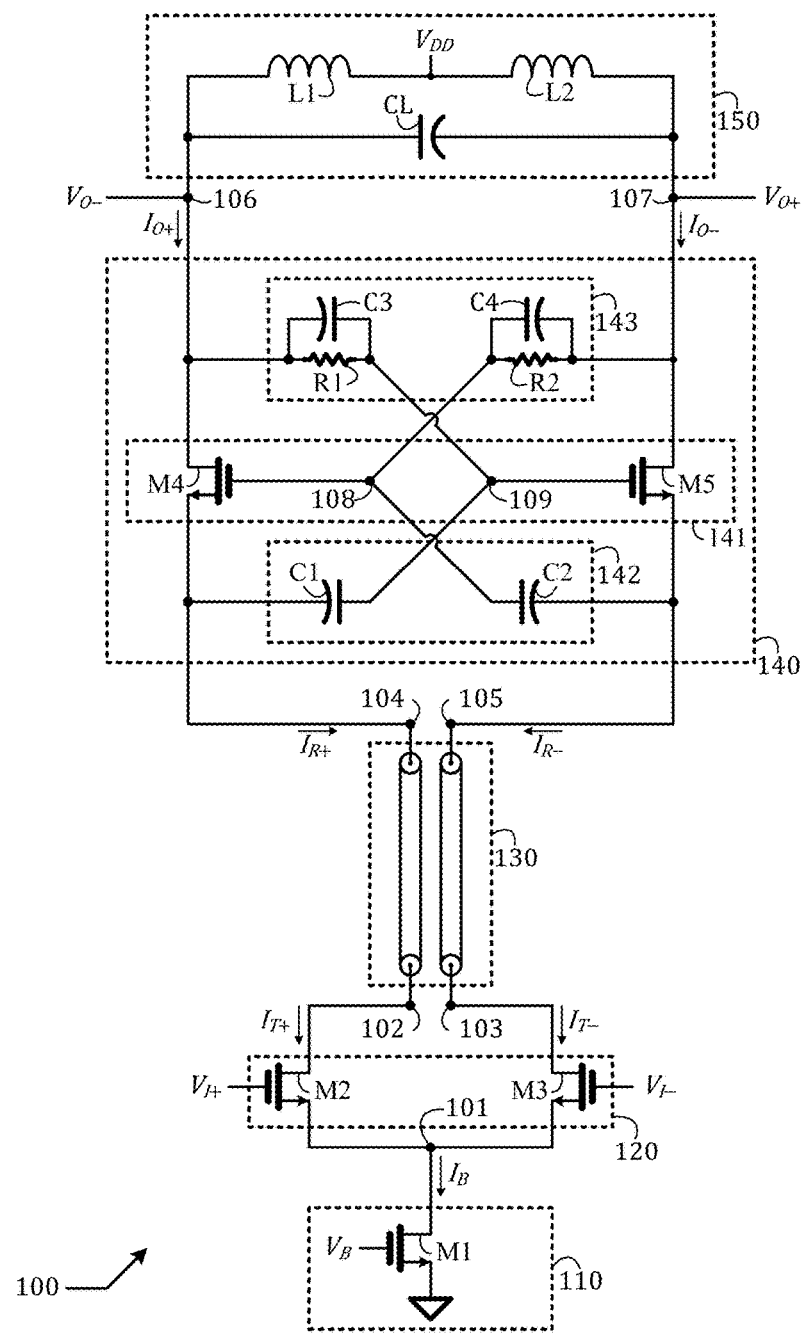
FIG. 1A shows a schematic diagram of a clock transmission circuit in accordance with an embodiment of the present disclosure.

The present disclosure is directed to clock transmission. While the specification describes several example embodiments of the disclosure considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the disclosure.

Persons of ordinary skill in the art understand terms and basic concepts related to microelectronics that are used in this disclosure, such as "circuit node," "power supply node," "ground node," "differential signal," "differential-pair" "voltage," "current," "CMOS (complementary metal oxide semiconductor)," "PMOS (P-channel metal oxide semiconductor) transistor," "NMOS (N-channel metal oxide semiconductor) transistor," "resistor," "inductor," "capacitor," "resonant tank," "clock," "signal," "frequency," "amplifier," "common-source," "common-gate," "impedance," "transmission line," "characteristic impedance" and "load." Terms and basic concepts like these are apparent to those of ordinary skill in the art and thus will not be explained in detail here. Those of ordinary skill in the art can also recognize symbols of PMOS transistor and NMOS transistor, and identify the "source," the "gate," and the "drain" terminals thereof.

This disclosure is presented in the context of an engineering/practical sense, instead of a rigorous mathematical sense. For instance, "A is equal to B" means "a difference between A and B is smaller than an engineering tolerance."

Throughout this disclosure, a ground node is used as a reference node of zero voltage (0V) electrical potential. A power supply node is denoted by "$V_{DD}$." A clock is a voltage signal that cyclically toggles back and forth between a low level (e.g. 0V) and a high level (e.g., the electrical potential at the power supply node "$V_{DD}$," or $V_{DD}$ for short).

A schematic diagram of a clock transmission circuit 100 in accordance with an embodiment of the present disclosure is depicted in FIG. 1. Clock transmission circuit 100 comprises: a current source 110 comprising a first NMOS transistor M1 configured to output a bias current $I_B$ to a first node 101 in accordance with a bias voltage $V_B$; a common-source differential pair 120 comprising a second NMOS transistor M2 and a third NMOS transistor M3 configured to receive a first input voltage $V_{1+}$ and a second input voltage $V_{1-}$ and output a first transmitted current $I_{T+}$ and a second transmitted current $I_{T-}$ to a second node 102 and a third node 103, respectively, in accordance with the bias current $I_B$ received from the first node 101; a differential transmission line 130 configured to receive the first transmitted current $I_{T+}$ and the second transmitted current $I_{T-}$ from the second node 102 and the third node 103 and output a first received current $I_{R+}$ and a second received current $I_{R-}$ to a fourth node 104 and a fifth node 105, respectively; a current buffer 140 configured to receive the first received current $I_{R+}$ and the second received current $I_{R-}$ from the fourth node 104 and the fifth node 105 and output a first output current $I_{O+}$ and a second output current $I_{O-}$ to a sixth node 106 and a seventh node 107, respectively; and a load 150 configured to provide a termination at the sixth node 106 and the seventh node 107 to convert the first output current $I_{O+}$ and the second output current $I_{O-}$ into a first output voltage $V_{O-}$ and a second output voltage $V_{O+}$, respectively.

Differential signaling is used, wherein the first input voltage $V_{1+}$ and the second input voltage $V_{1-}$ jointly defines a differential input signal and the first output voltage and $V_{O-}$ and the second output voltage $V_{O+}$ jointly defines a differential output signal. Current buffer 140 comprises a common-gate amplifier pair 141, an input-side cross-coupling network 142, and an output-side cross coupling network 143. The common-gate amplifier pair 141 comprises a fourth NMOS transistor M4 and a fifth NMOS transistor M5. The source, gate, and drain of the fourth (fifth) NMOS transistor M4 (M5) connect to the fourth (fifth) node 104 (105), an eighth (ninth) node 108 (109), and the sixth (seventh) node 106 (107), respectively. The input-side cross coupling network 142 comprises a first capacitor C1 configured to couple the fourth node 104 to the ninth node 109, and a second capacitor C2 configured to couple the fifth node 105 to the eighth node 108. The output-side cross-coupling network 143 comprises a first resistor R1 configured to couple the sixth node 106 to the ninth node 109 and a second resistor R2 configured to couple the seventh node 107 to the eighth node 108. In an optional embodiment, the output-side cross-coupling network 143 further comprises a third capacitor C3 configured to be in a parallel connection with the first resistor R1, and a fourth capacitor C4 configured to be in a parallel connection with the second resistor R2.

By way of example but not limitation, the load 150 comprises a first inductor L1, a second inductor L2, and a load capacitor CL, wherein L1, L2, and CL form a resonant network of a resonant frequency approximately equal to a fundamental frequency of the differential input signal; this way, the load 150 can have a high impedance to allow $V_{O-}$ and $V_{O+}$ to have a large swing.

In an embodiment, clock transmission circuit 100 is integrated on a silicon substrate using a CMOS process technology. By way of example but not limitation, clock transmission circuit 100 is fabricated using a 28 nm process that includes eight metal layers including a top metal layer, which is an aluminum layer referred to as a redistribution layer and denoted by "RDL," a thick metal layer denoted by "ME7" that is beneath the "RDL" layer, and a thin metal layer denoted by "ME6" that is beneath the "ME7" layer. In an embodiment, the differential transmission line 130 comprises two parallel metal traces laid out on the top metal layer (i.e. "RDL" layer).

In an application of interest, the differential input signal is a clock signal, wherein $V_{O+}$ and $V_{O-}$ are complementary and periodically toggle between a low level and a high level at a clock frequency. The high level is sufficiently high for turning on either NMOS transistor M2 or M3, and the low level is sufficiently low for turning off either NMOS transistor M2 or M3. When $V_{O+}$ ($V_{O-}$) is at the high level, NMOS transistor M2 (M3) is turned on; at the same time, $V_{O-}$ ($V_{O+}$) must be at the low level due to the complementary nature, and NMOS transistor M3 (M2) is turned off; as a result, the bias current $I_B$ is steered to node 102 (103) by NMOS transistor M2 (M3), causing $I_{T+}$ ($I_{T-}$) and $I_{T-}$ ($I_{T+}$) to be approximately equal to $I_B$ and 0, respectively. Consequently, $I_{T+}$ and $I_{T-}$ are complementary and periodically toggle between $I_B$ and 0 at the clock frequency. Clock transmission circuit is thus based on a current-mode transmission scheme, wherein the common-source differential pair 120 functions as a voltage-to-current converter that converts $V_{1+}$ and $V_{1-}$ into $I_{T+}$ and $I_{T-}$, respectively. When the input impedance of the current buffer 140 matches well with a characteristic impedance of the differential transmission line 130, $I_{T+}$ and $I_{T-}$ can be effectively transmitted by the differential transmission line 130 without encountering much reflection; in this case, $I_{R+}$ and $I_{R-}$ will be approximately equal to $I_{T+}$ and $I_{T-}$, respectively, except for an insertion loss and a propagation delay.

There are two major sources of insertion loss for a transmission line: conduction loss and dielectric loss. Conduction loss causes a voltage drop; while dielectric loss causes a current loss. Due to using the current-mode transmission scheme, the current loss is important, while the voltage drop is not (barring an extreme condition that the voltage drop is so severe that there is insufficient voltage headroom left for the signal transmission). The current loss of the differential transmission line 130 can be minimized by using parallel metal lines laid out on the top metal layer (i.e. the "RDL" layer), as it is farthest away from the substrate and thus has the smallest dielectric loss. Barring the extreme condition of insufficient voltage headroom, the insertion loss can be minimized despite using aluminum for conduction and thus suffering a greater voltage drop as compared to the case of using copper for conduction.

Note that differential transmission line 130 is a two-port network comprising a first port and a second port, wherein the first port is across nodes 102 and 103, and the second port is across nodes 104 and 105.

A current buffer is a circuit that receives an input current from an input side and output a current on an output side, so that an input impedance on the input side is substantially independent of an output impedance on the output side. For the current buffer 140, the input is on the side of nodes 104 and 105, while the output is on the side of nodes 106 and 107. The current buffer 140 is configured to provide an input impedance that approximately matches a characteristic impedance of the differential transmission line 130. In an embodiment, the characteristic impedance of the differential transmission line 130 is too small for the common-gate amplifier pair 141 to match without using the input-side cross-coupling network 142. The input-side cross-coupling network 142 is configured to reduce the input impedance of the common-gate amplifier pair 141 to better match the characteristic impedance of the differential transmission line 130. Due to the differential signaling, a rise (fall) of voltage at node 104 is always accompanied by a fall (rise) of voltage at node 105; when that happens, a feedback via capacitor C2 and NMOS transistor M4 can resist the rise (fall) of voltage at node 104, and a feedback via capacitor C1 and NMOS transistor M5 can resist the fall (rise) of voltage at node 105. Therefore, the input-side cross-coupling network 142 provide a negative feedback to counter a voltage change at nodes 104 and 105 and thus can reduce the input impedance of the common-gate amplifier pair 141. The output cross-coupling network 143 is configured to fulfill two purposes. First, it is used to establish a DC bias for NMOS transistors M4 and M5 via resistors R1 and R2. For the load 150 shown in FIG. 1, the DC voltages at the gates of NMOS transistor M4 and M5 will both be equal to $V_{DD}$. Second, it can provide a positive feedback to boost the effective output impedance for the common-gate amplifier pair 141 and thus improve the voltage gain of the current buffer 140. Resistors R1 and R2 alone can provide the positive feedback, while capacitors C3 and C4 are optional and can be incorporated to further enhance the positive feedback.

Figure 1B:
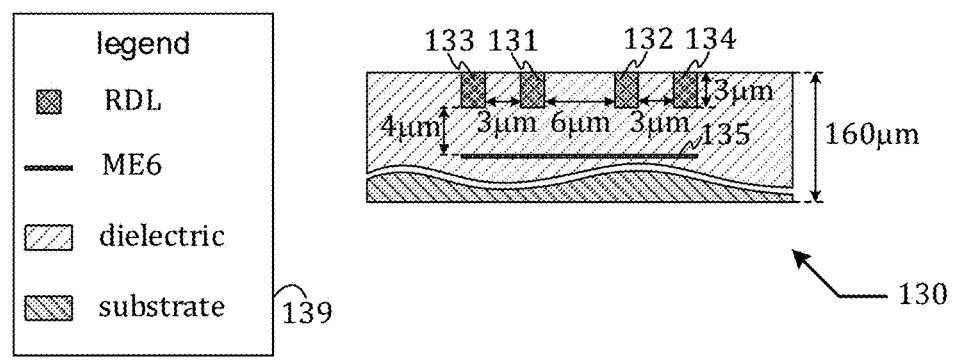
FIG. 1B shows a cross-sectional view of the differential transmission line of the clock transmission circuit of FIG. 1B.

By way of example but not limitation, in an embodiment: W/L (which stands for width/length) of NMOS transistor M1 is 21.6 μm/60 nm; W/L of NMOS transistors M2 and M3 are both 5.4 μm/60 nm; W/L of NMOS transistors M4 and M5 are both 30 μm/30 nm; capacitors C1 and C2 are both 80 fF; resistors R1 and R2 are both 1 KOhm; capacitors C3 an C4 are both 4 fF; inductors L1 and L2 are both 0.8 nH with a quality factor of 10; load capacitor CL is 100 fF; $V_{DD}$ is 1.1V; and $I_B$ is 2 mA. A cross-sectional view of the differential transmission line 130 of FIG. 1A is shown in FIG. 1B. Differential transmission line 130 comprises two parallel metal traces 131 and 132 that are both 2 μm wide and 3 μm thick and 6 μm apart and are used to transmit $I_{T+}$ and $I_{T-}$, respectively. Metal traces 131 and 132 are laid out on the top metal "RDL." Differential transmission line 130 further comprises two additional metal traces 133 and 134 that are used to provide a shielding for metal traces 131 and 132 and need to be connected to the ground node. The two additional metal traces 133 and 134 are also 2 μm wide and 3 μm thick and laid out on the "RDL" layer. The spacing between metal traces 133 and 131 is 3 μm, so is the spacing between metal traces 134 and 132. Differential transmission line 130 further comprises a ground plane 135 laid out on the "ME6" layer, wherein the ground plane 135 is also used to provide a shielding for metal traces 131 and 132 and needs to be connected to the ground node. The ground plane 135 is about 90 nm thin and is 4 μm under metal traces 131~134. Metal traces 131~134 and ground plane 135 are all embedded in a dielectric medium that is placed upon the substrate. A legend of the cross-sectional view is shown in box 139. As shown, the total height of the structure is 160 μm. As mentioned earlier, between "RDL" and "ME6," there is another metal layer "ME7" in the middle (not shown in figure). In a further embodiment not shown in figure but obvious to those ordinary skill in the art, two more metal traces are laid out on the metal layer "ME7," wherein both the two more metal traces are 2 μm wide, one placed right beneath metal trace 133 and above the ground plane 135, and the other placed right beneath metal trace 134 and above the ground plane 135. The two more metal traces are used to seal off the 4 μm gap between metal trace 133 and ground plane 135 and the 4 μm gap between metal trace 134 and ground plane 135. In an alternative embodiment, the ground plane 135 is laid out on a metal layer this is lower than "ME6." There are numerous alternative embodiments that can be used at the discretion of circuit designers. In any case, metal traces 131 and 132 need to be laid out on the top metal layer to reduce a current loss, as explained earlier, and the ground plane 135, if used, must be placed no higher than the third metal layer from the top lest it might significantly lower the characteristic impedance of the differential transmission line 130.

Figure 2:
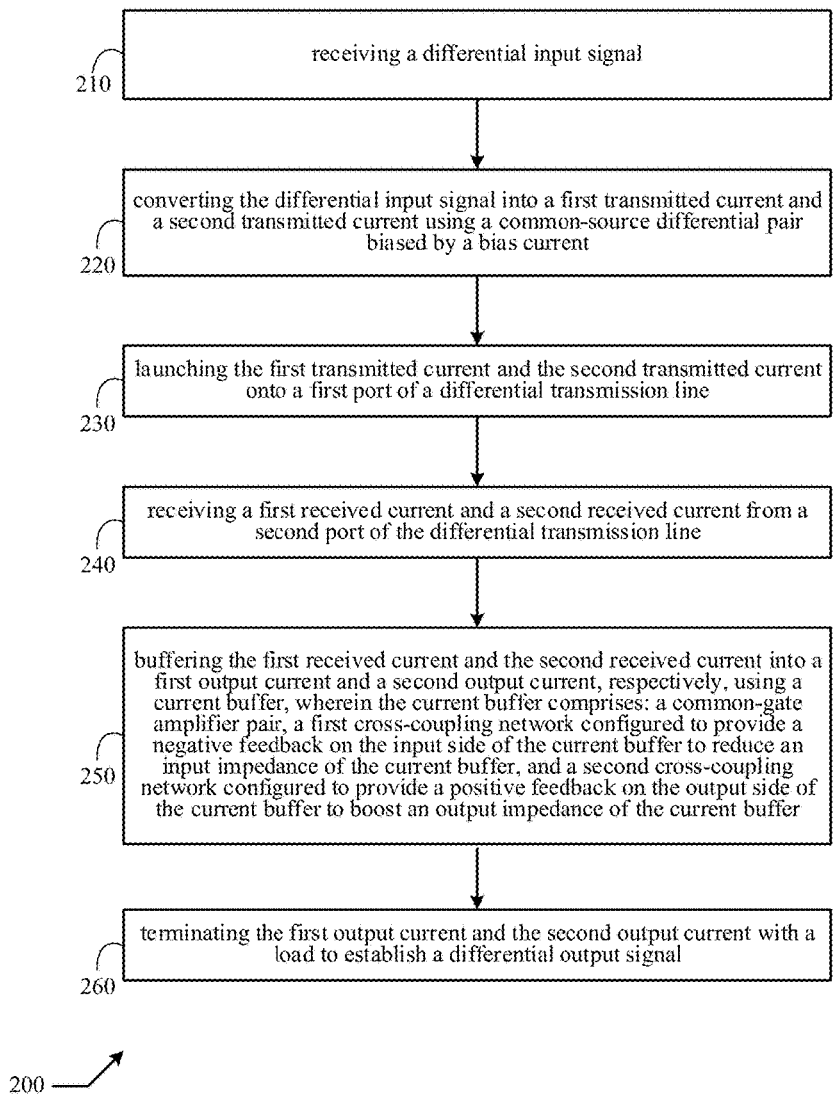
FIG. 2 shows a flow diagram of a method in accordance with an embodiment of the present disclosure.

As depicted in a flow diagram 200 shown in FIG. 2, a method in accordance with an embodiment of the present invention comprises: (step 210) receiving a differential input signal; (step 220) converting the differential input signal into a first transmitted current and a second transmitted current using a common-source differential pair biased by a bias current; (step 230) launching the first transmitted current and the second transmitted current onto a first port of a differential transmission line; (step 240) receiving a first received current and a second received current from a second port of the differential transmission line; (step 250) buffering the first received current and the second received current into a first output current and a second output current, respectively, using a current buffer, wherein the current buffer comprises: a common-gate amplifier pair, a first cross-coupling network configured to provide a negative feedback on the input side of the current buffer to reduce an input impedance of the current buffer, and a second cross-coupling network configured to provide a positive feedback on the output side of the current buffer to boost an output impedance of the current buffer; and (step 260) terminating the first output current and the second output current with a load to establish a differential output signal.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:
1. A circuit comprises:
a current source configured to output a bias current to a first node;
a common-source differential amplifier pair configured to receive the bias current and output a first transmitted current and a second transmitted current to a second node and a third node, respectively, in accordance with a control of a differential input signal;
a differential transmission line configured to receive the first transmitted current and the second transmitted current from the second node and the third node and output a first received current and a second received current to a fourth node and a fifth node, respectively;
a current buffer configured to receive the first received current and the second received current from the fourth node and the fifth node and output a first output current and a second output current to a sixth node and a seventh node, respectively, wherein: the current buffer comprises: a common-gate amplifier pair, a first cross-coupling network configured to provide a negative feedback on an input side of the current buffer to reduce an input impedance of the current buffer, and a second cross-coupling network configured to provide a positive feedback on an output side of the current buffer to boost an output impedance of the current buffer; and a load configured to provide a termination at the sixth node and the seventh node to establish a first output voltage and a second output voltage, respectively.

2. The circuit of claim 1, wherein the load comprises a resonant tank of a resonant frequency approximately equal to a fundamental frequency of the differential input signal.

3. The circuit of claim 1, wherein the circuit is fabricated using a CMOS (complementary metal oxide semiconductor) process with multiple metal layers including a top metal layer that is farthest away from a substrate of the circuit.

4. The circuit of claim 3, wherein the differential transmission line comprises two parallel metal traces comprising a first metal trace and a second metal trace laid out on the top metal layer, the first metal trace configured to receive the first transmitted current from the second node and output the first received current to the fourth node, the second metal trace configured to receive the second transmitted current from the third node and output the second received current to the fifth node.

5. The circuit of claim 4, wherein the differential transmission line further comprises two additional parallel metal traces comprising a third metal trace and a fourth metal trace laid out on the top metal layer, the two additional parallel metal traces configured to sandwich the first metal trace and the second metal trace.

6. The circuit of claim 5, wherein the two additional metal traces are connected to a ground node to provide a shielding for the first metal trace and the second metal trace.

7. The circuit of claim 4, wherein the differential transmission line further comprises a ground plane laid out on a metal layer that is at least two metal layers beneath the top metal layer.

8. The circuit of claim 7, wherein the ground plane is connected to a ground node to provide a shielding for the first metal trace and the second metal trace.

9. The circuit of claim 1, wherein: the common-gate amplifier pair comprises a first transistor and a second transistor; the source, gate, and drain of the first transistor connect to the fourth node, an eighth node, and the sixth node, respectively; the source, gate, and drain of the second transistor connect to the fifth node, a ninth node, and the seventh node, respectively.

10. The circuit of claim 9, wherein the first cross-coupling network comprises a first capacitor configured to couple the fourth node to the ninth node and a second capacitor configured to couple the fifth node to the eighth node, and the second cross-coupling network comprises a first resistor configured to couple the seventh node to the eighth node and a second resistor configured to couple the sixth node to the ninth node.

11. A method comprising:
receiving a differential input signal;
converting the differential input signal into a first transmitted current and a second transmitted current using a common-source differential pair biased by a bias current;
launching the first transmitted current and the second transmitted current onto a first port of a differential transmission line;
receiving a first received current and a second received current from a second port of the differential transmission line;
buffering the first received current and the second received current into a first output current and a second output current, respectively, using a current buffer, wherein the current buffer comprises: a common-gate amplifier pair, a first cross-coupling network configured to provide a negative feedback on an input side of the current buffer to reduce an input impedance of the current buffer, and a second cross-coupling network configured to provide a positive feedback on an output side of the current buffer to boost an output impedance of the current buffer; and
terminating the first output current and the second output current with a load to establish a differential output signal.

12. The method of claim 11, wherein the load comprises a resonant tank of a resonant frequency approximately equal to a fundamental frequency of the differential input signal.

13. The method of claim 11, wherein the method fabricates a circuit using a CMOS (complementary metal oxide semiconductor) process with multiple metal layers including a top metal layer that is farthest away from a substrate of the circuit.

14. The method of claim 13, wherein the differential transmission line comprises two parallel metal traces comprising a first metal trace and a second metal trace laid out on the top metal layer and configured to receive the first transmitted current and the second transmitted current, respectively, from the first port and output the first received current the second received current, respectively, to the second port.

15. The method of claim 14, wherein the differential transmission line further comprises two additional parallel metal traces comprising a third metal trace and a fourth metal trace laid out on the top metal layer, the two additional parallel metal traces configured to sandwich the first metal trace and the second metal trace.

16. The method of claim 15, wherein the two additional metal traces are connected to a ground node to provide a shielding for the first metal trace and the second metal trace.

17. The method of claim 14, wherein the differential transmission line further comprises a ground plane laid out on a metal layer that is at least two metal layers beneath the top metal layer.

18. The method of claim 17, wherein the ground plane is connected to a ground node to provide a shielding for the first metal trace and the second metal trace.

19. The method of claim 11, wherein: the common-gate amplifier pair comprises a first transistor configured to receive the first received current from its source and output the first output current via its drain and a second transistor configured to receive the second received current from its source and output the second output current via its drain.

20. The method of claim 19, wherein the first cross-coupling network comprises a first capacitor configured to couple the source of the first transistor to a gate of the second transistor, a second capacitor configured to couple the source of the second transistor to a gate of the first transistor, a first resistor configured to couple the drain of the first transistor to the gate of the second transistor, and a second resistor configured to couple the drain of the second transistor to the gate of the first transistor.

* * * * *